United States Patent
Bedell et al.

(10) Patent No.: US 6,825,102 B1
(45) Date of Patent: Nov. 30, 2004

(54) METHOD OF IMPROVING THE QUALITY OF DEFECTIVE SEMICONDUCTOR MATERIAL

(75) Inventors: Stephen W. Bedell, Wappingers Falls, NY (US); Keith E. Fogel, Mohegan Lake, NY (US); Shreesh Narasimha, Beacon, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/664,714

(22) Filed: Sep. 18, 2003

(51) Int. Cl.[7] ............................................ H01L 21/263
(52) U.S. Cl. ...................... 438/486; 438/517; 438/530; 438/933; 117/8
(58) Field of Search ........................... 438/4, 482, 486, 438/517, 530, 660, 663, 766, 933, FOR 385; 117/8

(56) References Cited

U.S. PATENT DOCUMENTS

| | | | | |
|---|---|---|---|---|
| 4,617,066 A | * | 10/1986 | Vasudev | ...................... 438/515 |
| 5,242,858 A | * | 9/1993 | Sakamoto et al. | ........... 438/365 |
| 5,476,799 A | * | 12/1995 | Sakamoto et al. | ........... 438/530 |
| 5,597,741 A | * | 1/1997 | Sakamoto et al. | ........... 438/532 |
| 6,528,387 B1 | * | 3/2003 | Moriyasu et al. | ............ 438/404 |
| 6,569,717 B1 | * | 5/2003 | Murade | ........................ 438/149 |
| 6,689,671 B1 | * | 2/2004 | Yu et al. | ....................... 438/486 |
| 2001/0012075 A1 | * | 8/2001 | Correa et al. | ................ 348/607 |
| 2001/0034088 A1 | * | 10/2001 | Nakamura et al. | ........... 438/166 |
| 2003/0139000 A1 | * | 7/2003 | Bedell et al. | ................ 438/186 |
| 2003/0143794 A1 | * | 7/2003 | Nakamura et al. | ........... 438/200 |

\* cited by examiner

*Primary Examiner*—George Fourson
*Assistant Examiner*—Joannie Adelle Garcia
(74) *Attorney, Agent, or Firm*—Scully, Scott, Murphy and Presser; Robert M. Trepp

(57) ABSTRACT

A method in which a defective semiconductor crystal material is subjected to an amorphization step followed by a thermal treatment step is provided. The amorphization step amorphizes, partially or completely, a region, including the surface region, of a defective semiconductor crystal material. A thermal treatment step is next performed so as to recrystallize the amorphized region of the defective semiconductor crystal material. The recrystallization is achieved in the present invention by solid-phase crystal regrowth from the non-amorphized region of the defective semiconductor crystal material.

30 Claims, 4 Drawing Sheets

METHOD OF IMPROVING THE QUALITY OF DEFECTIVE SEMICONDUCTOR MATERIAL

FIELD OF THE INVENTION

The present invention relates to a method of fabricating semiconductor structures, and more particularly to a method of improving the material quality near the surface of a defective semiconductor crystal.

BACKGROUND OF THE INVENTION

In current semiconductor technology, strained-silicon-on-insulator (SSOI) substrates are being considered for use in high-performance complementary metal oxide semiconductor (CMOS) device technology due to the improved charge carrier mobilities in strained-silicon-on-insulator substrates as compared to unstrained Si-on-insulator starting substrates (i.e., SOI).

Low defect density SiGe-on-insulator (SGOI) material is currently produced by one of two methods: 1) growth of a relaxed silicon germanium (SiGe) alloy layer on a bulk Si substrate and layer transfer of the relaxed SiGe alloy layer onto an oxidized "handle" substrate; or 2) growth of a strained SiGe alloy layer on an existing SOI substrate followed by high temperature annealing to homogenize and relax the SiGe alloy layer over the oxide layer.

After the SiGe-on-insulator (SGOI) has been formed, a layer of Si is grown epitaxially to make the strained silicon layer (tensile strain). Even with low defect SGOI, it is possible to create defects within the strained Si layer as a result of direct Si growth on the SiGe template. For strained silicon layers to be useful for modern CMOS integrated circuit (IC) technology, the number of defects within the electrically active regions of the material must be kept to a minimum.

To date, there is no prior art that is concerned with improving the material quality near the surface of defective semiconductor crystal materials such as SSOI substrates. The present invention provides a method whereby the material quality of a defective semiconductor material crystal is improved.

SUMMARY OF THE INVENTION

An object of the present invention is to provide a method for improving the near surface quality of a previous defective semiconductor crystal.

Another object of the present invention is to provide a method of improving the quality of a defective semiconductor crystal material that is simple, cost effective and is compatible with conventional CMOS processing.

A further object of the present invention is to provide a method of improving the quality of a defective bulk or heterostructure semiconductor crystal material.

These and other objects and advantages are achieved in the present invention by utilizing a method in which a defective semiconductor crystal material is subjected to an amorphization step followed by a thermal treatment step. In accordance with the present invention, the amorphization step amorphizes, partially or completely, a region, including the surface region, of a defective semiconductor crystal material. A thermal treatment step is next performed so as to recrystallize the amorphized region of the defective semiconductor crystal material. Specifically, the recrystallization is achieved in the present invention by solid-phase crystal regrowth from the non-amorphized region of the defective semiconductor crystal material.

The solid-state regrowth translates only those defects that extend past the amorphous layer and thus eliminates any Si (or other epitaxial layer) growth-related defects. As long as the semiconductor crystal material, for example Si/SiGe heterostructure, is thermodynamically stable with respect to strain-relieving defect production, the amorphized semiconductor crystal material will recrystallize with the same magnitude of strain without the introduction of additional defects. In the present invention, solid-phase recrystallization will occur as long as the amorphous region does not extend to a buried amorphous layer (e.g., a buried oxide layer) within the semiconductor crystal material or entirely through the semiconductor crystal material. In bulk strained-Si technology, layers will regrow with the defect density defined by the material quality at the amorphous/single crystal interface.

In broad terms, the method of the present invention comprises the steps of:

amorphizing, partially or completely, a region of a defective semiconductor crystal material; and thermally treating the amorphized defective semiconductor crystal material to recrystallize said partially or completely amorphized region forming a recrystallized region that has a reduced defect density as compared to the defective semiconductor crystal material.

DETAILED DESCRIPTION OF THE INVENTION

Figure 1:
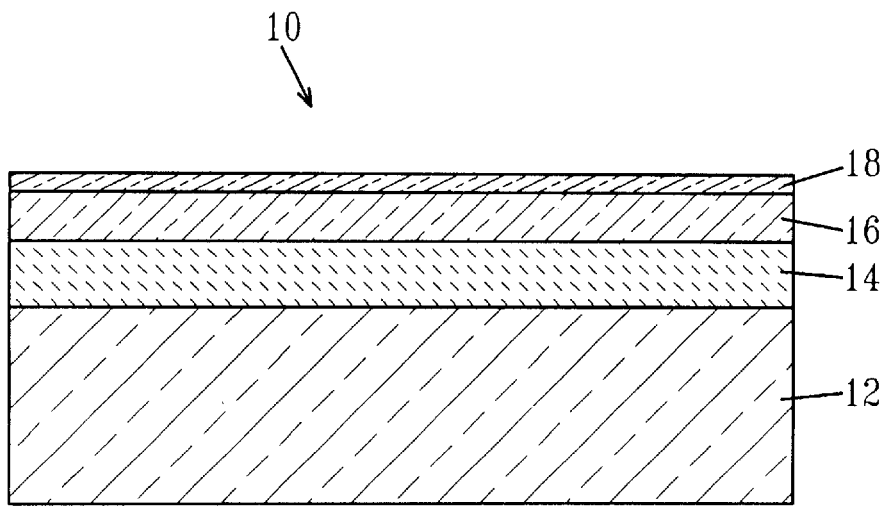
FIG. 1 is a pictorial representation (through a cross sectional view) illustrating one possible initial crystalline SSOI structure that can be employed in the present invention.

The present invention, which provides a method for improving the quality of a defective semiconductor crystal material, will now be described in greater detail by referring to the drawings that accompany the present application. In the accompanying drawings, like and/or corresponding elements are referred to by like reference numerals.

Reference is first made to FIG. 1 which shows one possible defective semiconductor crystal material 10 that can be employed in the present invention. Specifically, the defective semiconductor crystal material 10 illustrated in FIG. 1 is an SSOI substrate that comprises a bottom semiconductor layer 12, a Ge resistant diffusion barrier 14, a relaxed (partially or fully) SiGe alloy layer 16 and a strained (in a tensile manner) Si layer 18.

Although the drawings of the present invention as well as the description that follow describe the defective semiconductor crystal material as an SSOI heterostructure, the present invention is not limited to only that type of defective semiconductor crystal material. Instead, the present invention works equally well with other types of defective semiconductor crystal materials. Examples of the other types of defective semiconductor crystal materials that can also be employed in the present invention include, but are not limited to: Si, SiGe, SiGeC, SiC, Ge, GaAs, InP, InAs, and other III/V compound semiconductors.

The semiconductor crystal material 10 containing defects may be a bulk substrate or wafer, a multilayered semiconductor having at least one of the aforementioned semiconductor materials as the uppermost layer, or another heterostructure. For example, silicon-on-insulators, or SiGe-on-insulators (SGOIs) can be used as the defective semiconductor crystal material 10. The density of defects present in the defective semiconductor crystal material 10 is about 100 defects/cm$^2$ or greater, with an amount of defects from about 10 to about $10^4$ defects/cm$^2$ for SOI substrates and from about $10^4$ to about $10^8$ defects/cm$^2$ for SGOI substrates being more typical. The term "defect" includes threading defects, stacking faults, microtwins and combinations thereof.

The defective semiconductor crystal material 10 is made using conventional methods that are well known to those skilled in the art. For example, crystal growing or pulling can be used in forming bulk semiconductor crystal materials. SIMOX (separation by ion implantation of oxygen) or wafer bonding can be used in forming SOI substrates. One method to form SGOI substrates, such as depicted in FIG. 1, is by growth of a relaxed silicon germanium (SiGe) alloy layer on a bulk Si substrate followed by layer transfer of the relaxed SiGe alloy layer onto an oxidized "handle" substrate. Another method to form SGOI substrates is by growth of a strained SiGe alloy layer on an existing SOI substrate followed by high temperature annealing to homogenize and relax the SiGe alloy layer over the oxide layer. In either of the above two methods used to produce SGOI substrates, a Si layer or a Si/SiGe heterostructure can be grown epitaxially on the surface of the SGOI substrate to form an SSOI substrate.

Next, an upper region of the defective semiconductor structure 10 extending downward from the upper surface thereof is partially or completely amorphized. Amorphization can be performed using ion implantation, for example, into the surface of the defective semiconductor structure 10 which is initially single crystal. Amorphization by ion implantation occurs when the ions impinging on the surface region of the defective semiconductor structure 10 displaces enough substrate atoms to eliminate long-range crystalline order in the surface region. The process of amorphization usually occurs by the initial formation of microscopic amorphous clusters at a critical dose. The amorphous clusters then grow in size as the implantation process continues until the amorphous clusters overlap. The condition of the surface region between the onset of amorphous cluster formation and amorphous cluster overlap is considered to be partially amorphized. When the amorphous clusters are overlapping, the surface region is considered to be completely amorphized.

Figure 2:
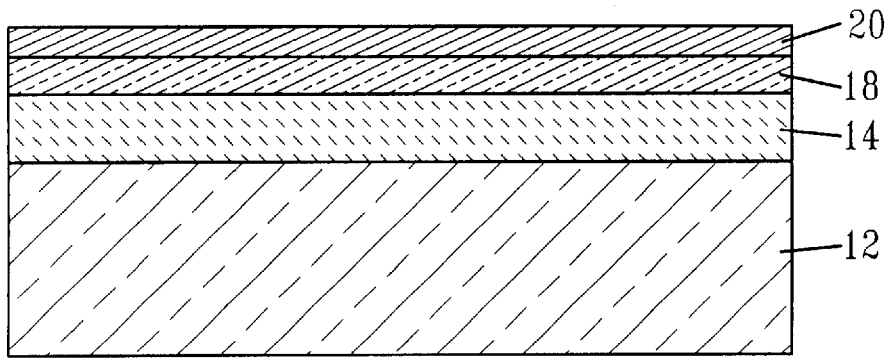
FIG. 2 is a pictorial representation (through a cross sectional view) illustrating formation of an amorphous region in the initial crystalline structure of FIG. 1.

In the example shown, the strained Si layer 18 and the relaxed SiGe alloy layer 16 of the SSOI substrate are partially or completely amorphized. The amorphized region is labeled as 20 in FIG. 2. As shown, the amorphized region extends from the surface downwards to a depth determined by the conditions used during amorphization. The depth of the amorphized region 20 should not extend into the Ge resistant diffusion layer 14 of the SSOI structure shown. When SOI structures are used, the amorphized region 20 does not extend into the buried oxide layer. When a bulk semiconductor crystal material is employed, the amorphized region 20 does not extend entirely through the bulk material.

Typically, the depth of the amorphous region 20, as measured from the upper surface of the defective semiconductor crystal material 10, is from about 1 to about 200 nm, with a depth from about 5 to about 100 nm being more typical.

The amorphized region 20 can be formed utilizing any process that creates an amorphized region in a crystalline semiconductor material, yet is compatible with conventional CMOS processing and materials. In one embodiment of the present invention, the amorphized region 20 is formed by ion implantation. The ion implantation process may be performed using a conventional beamline implanter, or a plasma immersion implanter. In yet another embodiment of the present invention, an energetic plasma of the amorphization ions can be employed. In this embodiment, the plasma may be generated by a radio-frequency (RF) or direct-current (DC) plasma discharge source.

In any of the cases mentioned above, the amorphization is performed in the presence of energetic ions that are capable of forming the partially or completely amorphized region 20. Illustrative examples of energetic ions that can be used in the present invention for generating the amorphized region 20 within the defective semiconductor crystal material 10 include B, Ga, In, C, Si, Ge, N, P, As, Sb, rare gas ions such as Ne, Ar, Kr, Xe, or any isotope and mixtures thereof. In one embodiment, it is preferred to use Ge or its isotopes as the energetic ions.

Of the various methods mentioned above, it is preferred to use a beamline implanter and to implant the energetic ions into the defective semiconductor crystal material. When a beamline implanter is employed, the energetic ions are implanted at a dose from about $10^{12}$ to about $10^{16}$ atoms/cm$^2$, with a dose from about $10^{13}$ to about mid-$10^{15}$ atoms/cm$^2$, depending on the ion used, being more highly preferred. The energy of the implant may vary depending on the type of energetic ions being implanted into the semiconductor crystal material.

The implant may be performed in a continuous mode, or the implant may be performed using a pulse mode. The implant may be performed across the whole surface of the defective semiconductor crystal material, or a patterned implantation process may be used to form amorphous regions that are separated from each other by non-amorphous regions. The patterned structures can also be formed using the other techniques mentioned above by applying a patterned masking layer atop the defective semiconductor material. The patterned masking layer is formed by deposition and lithography. The patterned masking layer is composed of a material which does not permit energetic ions from passing there through or it has a sufficient thickness that prevents the energetic ions from passing there through.

In some embodiments of the present invention, it is also possible to maintain the temperature of the defective semiconductor crystal material to below room temperature (<20° C.) in order to make the amorphization process more efficient. Specifically, lowering the temperature of the crystalline material will reduce the rate of lattice recrystallization during the implant process itself (referred to as self-annealing or in situ annealing). Using this approach, the condition of partial or complete amorphization is attained with a lower total ion dose than is otherwise possible.

Figure 3:
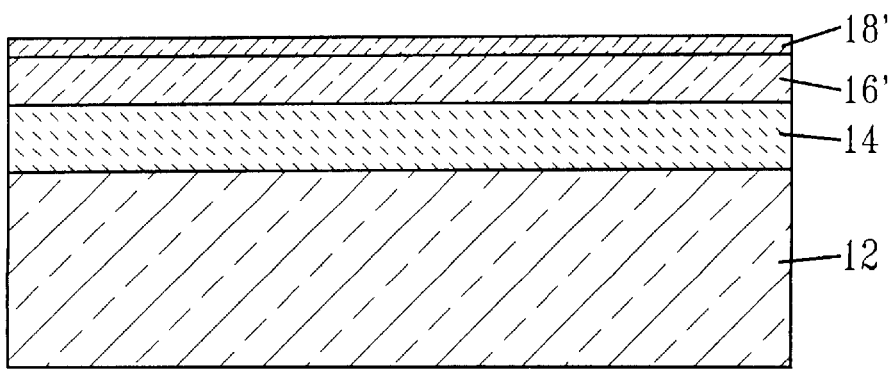
FIG. 3 is a pictorial representation (through a cross sectional view) illustrating the structure of FIG. 2 after recrystallization.

Next, and as shown in FIG. 3, the structure including the amorphous region 20 is then subjected to a beat treatment step that is capable of recrystallizing the amorphous region 20 into a recrystallized layer (or layers) that has a reduced defect density. In FIG. 3, reference numerals 18' and 16' refer to the recrystallized layers of the SSOI substrate. Recrystallization of the layers 16 and 18 is accomplished by a solid-phase crystal regrowth from the lower non-amorphized region of the semiconductor crystal material. The solid-phase regrowth will translate only those defects that extend past the amorphous region and thus annihilate any Si growth-related defects. As long as the SiGe and Si layers, i.e., layers 16 and 18, are thermodynamically stable with respect to strain-relieving defect production, the layers will recrystallize with the same magnitude of strain without the introduction of additional defects.

That is, a thermal treatment is used to recover the crystallinity of layers 16 and 18. This occurs by solid-phase crystal regrowth from a single-crystal/amorphous layer interface. The single-crystal interface grows from the lower single-crystal SiGe layer upwards towards the surface. This process is physically similar to gas-phase epitaxial growth in that the starting crystalline layer (seed layer) acts as a template for regrowth. Therefore, the amorphized layers will regrow in the same strained state that they originally possessed.

The thermal treatment step of the present invention is an annealing step which is performed at a temperature of about 500° C. or greater. More specifically, the thermal treatment step of the present invention is performed at a temperature from about 550° to about 1100° C. Moreover, the thermal treatment step of the present invention is carried out in an inert gas such as He, Ar, $N_2$, Xe, Kr, Ne or mixtures thereof. Preferred inert gases employed in the present invention include $N_2$, He, Ar or mixtures thereof. The inert gas may be diluted with an at least one oxygen-containing gas such as $O_2$, NO, $N_2O$, ozone, and air. The thermal treatment step may be carried out at a single targeted temperature, or various ramp and soak cycles using various ramp rates and soak times can be employed.

The thermal treatment step of the present invention includes a furnace anneal, a rapid thermal anneal, or a spike anneal. When a furnace anneal is employed, the furnace anneal is typically carried out at a temperature of about 500° C. or greater for a time period of about 15 minutes or greater. Preferably, the furnace anneal is performed at a temperature from about 650° C. to about 800° C. for a time period of from about 15 to about 250 minutes.

When a rapid thermal anneal (RTA) is employed, the RTA is typically carried out at a temperature of about 800° C. or greater for a time period of about 10 minutes or less. Preferably, the RTA is performed at a temperature from about 900° C. to about 1050° C. for a time period of from about 1 to about 30 seconds.

When a spike anneal is performed, the spike anneal is typically performed at a temperature of about 900° C. or greater for a time period of about 5 seconds or less. Preferably, the spike anneal is performed at a temperature from about 900° C. to about 1100° C.

The method of the present invention, which comprises amorphization and recrystallization, is capable of reducing the defect density of a previously preformed and defective semiconductor crystal material. A reduction of defect density of from about 10% to greater than 95% can be achieved in the present invention.

The use of multiple iterations of amorphization/recrystallization cycles is also contemplated herein.

Figure 4:
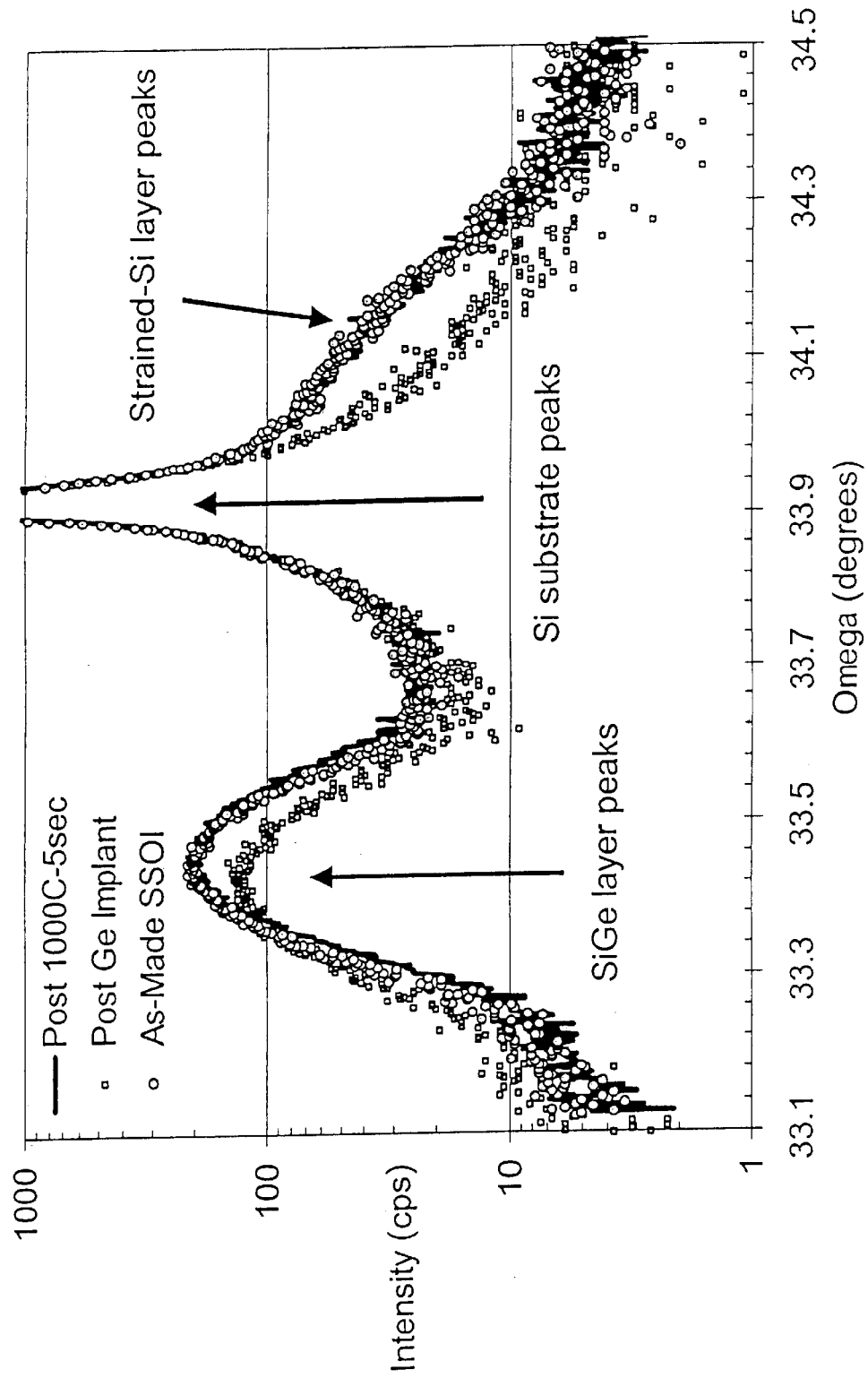
FIG. 4 is a X-ray rocking curve data from an SSOI substrate with 200 Å of strained Si grown on a 400 Å SiGe as grown (represented by filled circles), after 3E14 atoms/$cm^2$, 15 keV Ge implantation (represented by squares) and after 1000° C.-5 sec. thermal anneal (represented by the solid line).

FIG. 4 is an actual X-ray rocking curve data from an SSOI substrate with 200 Å of strained Si grown on 400 Å SiGe as-grown (filled circles), after a 3E14 Ge/cm$^2$, 15 keV Ge implantation (squares) and after 1000° C./5 sec thermal anneal (solid line). The strain state of the Si layer is clearly recovered and is represented by the shoulder to the right of the large substrate peak. The magnitude of the strain in the Si is about 0.5%.

Figure 5:
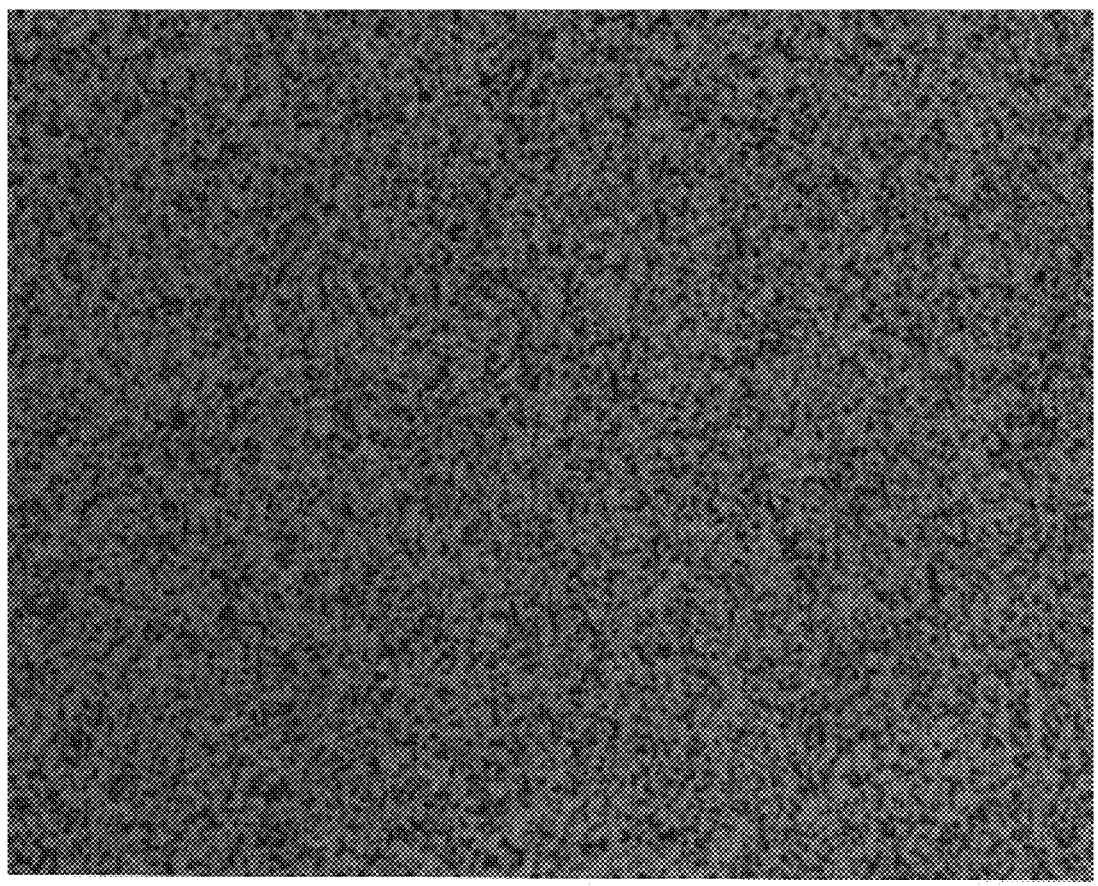
FIG. 5 is an optical micrograph showing the etching defects, i.e., pit defects, resulting from an as grown-SSOI substrate prior to amorphization and recrystallization.

FIG. 5 is an actual optical micrograph showing the pit defects of a preformed SSOI substrate. The pit defects had a measured density of about $10^8$ pits/cm$^2$.

Figure 6:
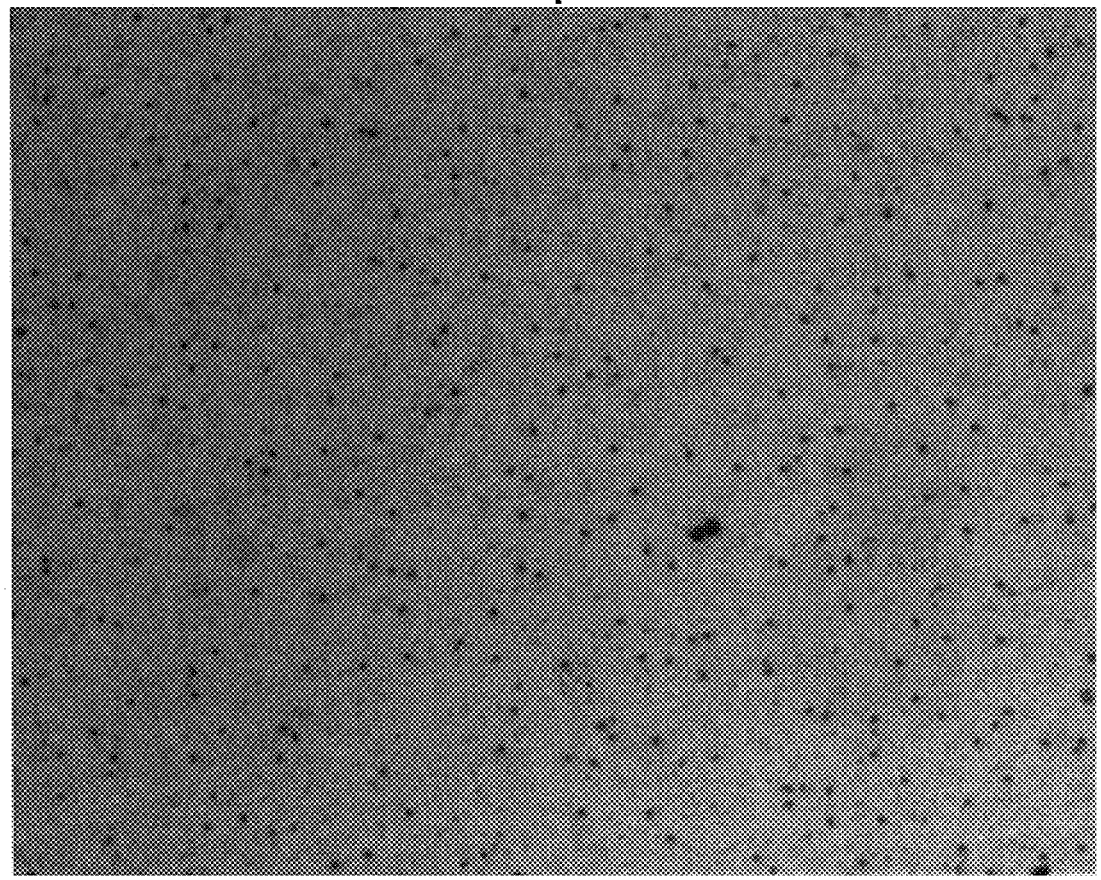
FIG. 6 is an optical micrograph of the SSOI substrate of FIG. 5 after amorphization and recrystallization.

FIG. 6 is an actual optical micrograph of the same SSOI structure shown in FIG. 5 after amorphization and recrystallization. The measured pit defect density was 5.5E6 pits/cm$^2$. Note that FIGS. 5 and 6 are on the same SSOI substrate and the same magnification is employed. A reduction in pit defects by greater than 2 orders of magnitude is observed.

While the present invention has been particularly shown and described with respect to preferred embodiments thereof, it will be understood by those skilled in the art that the forgoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of improving the material quality of a defective semiconductor crystal material comprising the steps of:

amorphizing, partially or completely, a region of a defective semiconductor crystal material to form an amorphized region, said defective semiconductor crystal material comprising a heterostructure containing epitaxial growth-related defects and said amorphized region does not extend to a buried insulating layer within said defective semiconductor crystal material; and thermally treating the amorphized region to recrystallize said partially or completely amorphized region forming a recrystallized region that has a reduced defect density, in terms of said epitaxial growth-related defects, as compared to the defective semiconductor crystal material.

2. The method of claim 1 wherein the defective semiconductor crystal material comprises a Si layer formed atop a SiGe alloy layer.

3. The method of claim 2 wherein the Si layer is strained in a tensile manner, and the SiGe alloy layer is partially or completely relaxed.

4. The method of claim 2 wherein the SiGe alloy layer is located atop a Ge resistant diffusion barrier layer.

5. The method of claim 1 wherein the defective semiconductor crystal material comprises a semiconductor selected from the group consisting of Si, SiGe, SiGeC, SiC, Ge, GaAs, InP, InAs, silicon-on-insulators, and SiGe-on-insulators.

6. The method of claim 1 wherein said amorphizing is carried out using ions that are capable of forming said amorphized region.

7. The method of claim 6 wherein said ions are selected from the group consisting of B, Ga, In, C, Si, Ge, N, P, As, Sb, rare gas ions, and any isotope or mixtures thereof.

8. The method of claim 6 wherein said ions comprise Ge or its isotopes.

9. The method of claim 1 wherein said amorphizing is carried out by ion implantation.

10. The method of claim 9 wherein the defective semiconductor crystal material is maintained at a temperature below 20° C. during said ion implantation.

11. The method of claim 1 when in said amorphizing is carried out by plasma immersion implantation.

12. The method of claim 1 wherein said amorphizing is carried out by a plasma discharge source.

13. The method of claim 12 wherein said plasma discharge source is a radio-frequency or a direct-current plasma discharge source.

14. The method of claim 1 wherein said amorphized region has a depth, as measured from an upper surface of the defective semiconductor crystal material, from about 1 to about 200 nm.

15. The method of claim 1 wherein said amorphizing is performed by ion implantation using an ion dose of about $10^{12}$ to about $10^{16}$ atoms/cm$^2$.

16. The method of claim 1 wherein said step of thermally treating is performed in an inert gas ambient.

17. The method of claim 16 where said inert gas comprises He, Ar, $N_2$, Xe, Kr, Ne or mixtures thereof.

18. The method of claim 16 wherein said inert gas ambient is diluted with an oxygen-containing gas.

19. The method of claim 1 wherein said step of thermally treating is performed at a temperature of about 500° C. or greater.

20. The method of claim 1 wherein said step of thermally treating comprises a furnace anneal.

21. The method of claim 20 wherein said furnace anneal is performed at a temperature of about 500° C. or greater for a time period of about 15 minutes or greater.

22. The method of claim 1 wherein said step of thermally treating comprises a rapid thermal anneal (RTA).

23. The method of claim 22 wherein said RTA is carried out at a temperature of about 800° C. or greater for a time period of about 10 minutes or less.

24. The method of claim 1 wherein the step of thermally treating comprises a spike anneal.

25. The method of claim 24 wherein the spike anneal is performed at a temperature of about 900° C. or greater for a time period of about 5 seconds or less.

26. The method of claim 1 wherein the step of thermally treating is performed to a single targeted temperature.

27. The method of claim 1 wherein the step of thermally treating is performed using various ramp and soak cycles.

28. The method of claim 1 wherein the steps of amorphizing and thermally treating are repeated any number of times.

29. A method of improving the material quality of a defective semiconductor crystal material comprising the steps of:

introducing ions into a region of a defective semiconductor crystal material to form an amorphized region within said defective semiconductor crystal material, said defective semiconductor crystal material comprising a heterostructure containing epitaxial growth-related defects and said amorphized region does not extend to a buried insulating layer within said defective crystal material; and heating the defective semiconductor crystal material containing said amorphized region to recrystallize said amorphized region forming a recrystallized region that has a reduced defect density, in terms of said epitaxial growth-related defects, as compared to the defective semiconductor crystal material.

30. A method of improving the material quality of a defective semiconductor crystal material comprising the steps of:

implanting ions into a region of a defective semiconductor crystal material to form an amorphized region within said defective semiconductor crystal material, said implant is performed at an ion dose from about $10^{12}$–$10^{16}$ atoms/cm$^2$, said defective semiconductor crystal material comprising a heterostructure containing epitaxial growth-related defects and said amorphized region does not extend to a buried insulating layer within said defective crystal material; and heating the defective semiconductor crystal material containing the amorphized region to recrystallize said amorphized region forming a recrystallized region that has a reduced defect density, in terms of said epitaxial growth-related defects, as compared to the defective semiconductor crystal material, said heating is performed using a rapid thermal anneal that is carried out a temperature of about 800° C. or greater for a time period of about 10 minutes or less.

* * * * *